(12) United States Patent
Park et al.

(10) Patent No.: US 11,665,955 B2
(45) Date of Patent: May 30, 2023

(54) FLEXIBLE DISPLAY APPARATUS

(71) Applicant: Samsung Display Co., Ltd., Yongin-si (KR)

(72) Inventors: Juyoung Park, Yongin-si (KR); Junho Kwack, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 17/161,543

(22) Filed: Jan. 28, 2021

(65) Prior Publication Data

US 2022/0020940 A1 Jan. 20, 2022

(30) Foreign Application Priority Data

Jul. 15, 2020 (KR) .................. 10-2020-0087709

(51) Int. Cl.
| | |
|---|---|
| *H01L 51/00* | (2006.01) |
| *H01L 27/32* | (2006.01) |
| *H01L 51/52* | (2006.01) |
| *B32B 7/12* | (2006.01) |
| *B32B 7/022* | (2019.01) |
| *B32B 15/08* | (2006.01) |

(52) U.S. Cl.
CPC .......... *H01L 51/0097* (2013.01); *B32B 7/022* (2019.01); *B32B 7/12* (2013.01); *B32B 15/08* (2013.01); *H01L 27/3244* (2013.01); *H01L 51/5253* (2013.01); *B32B 2307/54* (2013.01); *B32B 2307/584* (2013.01); *B32B 2457/206* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2016/0211482 A1* | 7/2016 | Namkung | H01L 51/5246 |
| 2018/0180911 A1* | 6/2018 | Odaka | H01L 51/5293 |
| 2018/0246544 A1 | 8/2018 | Kwon et al. | |
| 2018/0352664 A1* | 12/2018 | Park | B32B 5/18 |
| 2019/0318689 A1 | 10/2019 | Kim | |
| 2019/0373719 A1 | 12/2019 | Lee et al. | |
| 2020/0075872 A1* | 3/2020 | Gu | B32B 27/06 |
| 2020/0171787 A1 | 6/2020 | Lim et al. | |
| 2022/0141967 A1* | 5/2022 | Gu | B32B 7/02 |
| | | | 361/807 |

FOREIGN PATENT DOCUMENTS

| | | |
|---|---|---|
| KR | 10-2018-0032742 | 4/2018 |
| KR | 10-2018-0068382 | 6/2018 |
| KR | 10-2019-0119244 | 10/2019 |
| KR | 10-2019-0137976 | 12/2019 |

\* cited by examiner

*Primary Examiner* — J. E. Schoenholtz
(74) *Attorney, Agent, or Firm* — H.C. Park & Associates, PLC

(57) ABSTRACT

A flexible display apparatus includes: a flexible display panel including a first area, a second area, and a bending area between the first area and the second area; a first protection layer including a first surface facing the flexible display panel and a second surface opposite to the first surface; and a driving unit electrically connected to the flexible display panel. The first protection layer is disposed continuously over the first area, the second area, and the bending area to be adhered to the flexible display panel.

16 Claims, 7 Drawing Sheets

FLEXIBLE DISPLAY APPARATUS

CROSS-REFERENCE TO RELATED APPLICATION

This application claims priority from and the benefit of Korean Patent Application No. 10-2020-0087709, filed on Jul. 15, 2020, which is incorporated by reference for all purposes as if fully set forth herein.

BACKGROUND

Field

The invention relates generally to a display apparatus, and more particularly, to a flexible display apparatus.

Discussion of the Background

In general, a display apparatus may be used in mobile devices such as smart phones, laptop computers, digital cameras, camcorders, portable information terminals, notebook computers, and tablet personal computers or electronic devices such as desktop computers, televisions, outdoor billboards, exhibition display devices, vehicle dashboards, and head-up displays (HUDs).

Recently, a slimmer display apparatus has been released. A flexible display apparatus is easy to carry and may be applied to electronic devices and mobile devices of various shapes. Among them, a flexible display apparatus based on organic light-emitting display technology are the most potent flexible display apparatus. The flexible display apparatus may include a bending area to be bent in one direction.

The above information disclosed in this Background section is only for understanding of the background of the inventive concepts, and, therefore, it may contain information that does not constitute prior art. [the end of discussion]

SUMMARY

Applicant discovered that, in a flexible display apparatus, a crack may occur in and/or near a bending area due to a difference in the properties of elements disposed in and/or near the bending area. For example, defects may occur in signal lines of the bending area when the flexible display apparatus is bent. To prevent the crack from occurring in the bending area, it may be necessary to omit some of the elements, such as a bending protection layer disposed on the outer surface of the bending area. However, in case where the bending protection layer is omitted, the strength of the flexible display apparatus may degrade.

Flexible display apparatus constructed according to the principles and exemplary implementations of the invention are capable of having reinforced mechanical strength. For example, the flexible display apparatus may include a curved and/or bent display panel and a protection film having a relatively low modulus and disposed on the entire inner surface of the curved and/or bent display panel. Accordingly, the protection film may have proper bending rigidity and may improve the mechanical strength of the flexible display apparatus and the curved and/or bent display panel.

Additional features of the inventive concepts will be set forth in the description which follows, and in part will be apparent from the description, or may be learned by practice of the inventive concepts.

According to one aspect of the invention, a flexible display apparatus includes: a flexible display panel including a first area, a second area, and a bending area between the first area and the second area; a first protection layer including a first surface facing the flexible display panel and a second surface opposite to the first surface; and a driving unit electrically connected to the flexible display panel. The first protection layer is disposed continuously over the first area, the second area, and the bending area to be adhered to the flexible display panel.

The first protection layer may include a first protection film including a first portion corresponding to the first area, a second portion corresponding to the second area, and a third portion corresponding to the bending area, and the first portion, the second portion, and the third portion may extend integrally over the first area, the second area, and the bending area.

The first portion, the second portion, and the third portion may have a thickness substantially the same as each other.

The first protection film may be disposed inside the flexible display panel that is bent.

The flexible display apparatus may further include an adhesive member. The first portion and the second portion of the first protection film may face each other inside the flexible display panel that is bent, and the adhesive member may be disposed between the first portion and the second portion.

The flexible display apparatus may further include a metal sheet disposed on the second surface under the first portion of the first protection film. A first surface of the metal sheet may contact the second surface of the first protection film, and a second surface of the metal sheet may be adhered to the adhesive member.

The flexible display apparatus may further include a second protection film disposed on the second surface under the second portion of the first protection film.

The first protection film may be located inside the flexible display panel that is bent, and the second protection film may be disposed between the first portion and the second portion of the first protection film that is bent.

The flexible display apparatus may further include an adhesive member. The first portion and the second portion of the first protection film may face each other inside the flexible display panel that is bent, the adhesive member may be disposed between the first portion and the second portion, and the second protection film may be disposed between the second portion and the adhesive member.

The flexible display apparatus may further include a metal sheet disposed on the second surface under the first portion. A first surface of the metal sheet may contact the second surface of the first protection film, and a second surface of the metal sheet may be adhered to the adhesive member.

The second protection film may have a modulus higher than a modulus of the first protection film.

The modulus of the first protection film may be in a range from about 50 MPa to about 500 MPa, and the modulus of the second protection film may be about 1000 MPa or more.

The first protection film may include a polymer resin having a modulus in a range from about 50 MPa to about 500 MPa.

The flexible display panel may include an out-foldable flexible display panel.

According to another aspect of the invention, a flexible display apparatus includes: a flexible substrate bent around a bending axis and including a display area to display an image and a non-display area extending outside the display area; an encapsulation layer covering the display area; at least one functional layer disposed on the thin film encapsulation layer; a first protection layer including a first surface facing the flexible substrate and a second surface opposite to the first surface; and a driving unit electrically connected to the display area. The first protection layer is disposed continuously on a surface of the flexible substrate opposite to the encapsulation layer.

The first protection layer may include a first protection film extending integrally over the entire area of a surface of the flexible substrate that is bent.

The flexible display apparatus may further include an adhesive member. The first protection film may be disposed inside the flexible substrate that is bent, portions of the first protection film may face each other inside the flexible substrate, and the adhesive member may be disposed between the portions of the first protection film.

The flexible display apparatus may further include a second protection film having a higher modulus than the first protection film and disposed under the first protection film.

The first protection film may be disposed inside the flexible substrate that is bent, and the second protection film may be disposed between portions of the first protection film facing each other.

The first protection film may have a modulus in a range from about 50 MPa to about 500 MPa, and the second protection film may have a modulus of about 1000 MPa or more.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
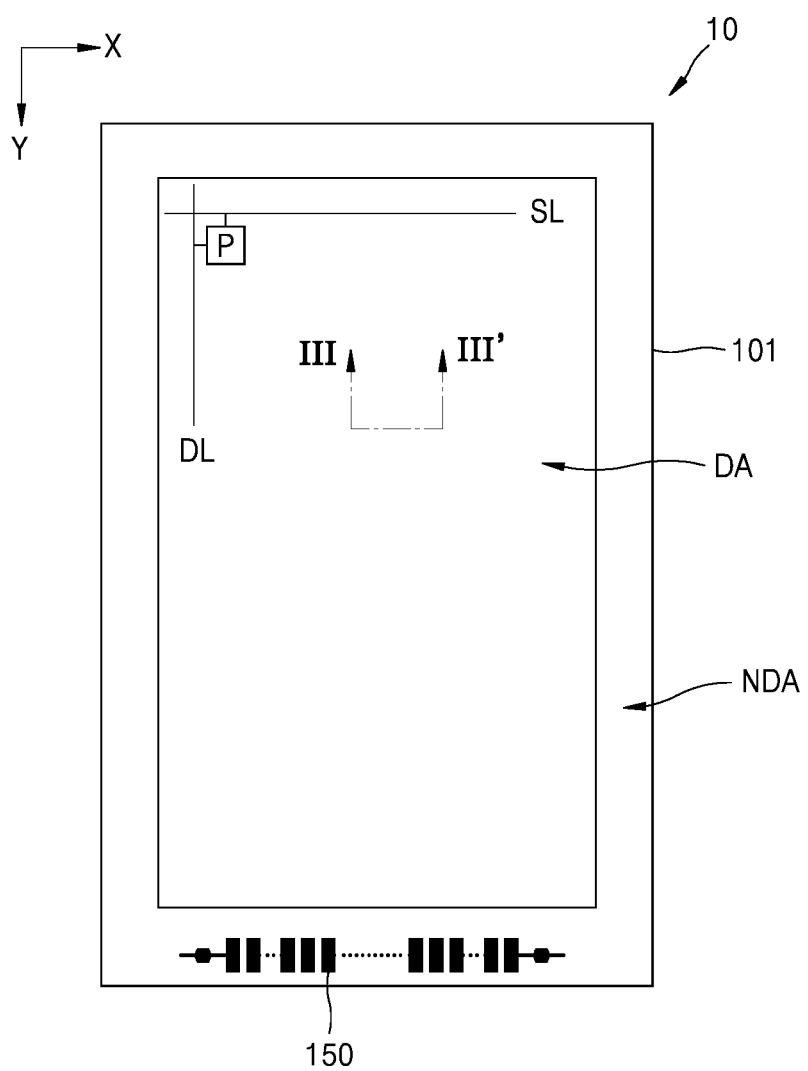
FIG. 1 is a plan view of an embodiment of a flexible display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a flexible display apparatus constructed according to the principles of the invention.

Referring to FIG. 1, the flexible display apparatus 10 may be an apparatus that displays an image. An organic light emitting display apparatus will be described as an example of the flexible display apparatus 10. However, embodiments are not limited thereto. In an embodiment, the flexible display apparatus 10 may be a display apparatus such as an inorganic light emitting display apparatus or a quantum dot light emitting display apparatus. An emission layer of the flexible display apparatus 10 may include an organic material, may include an inorganic material, may include quantum dots, may include an organic material and quantum dots, or may include an inorganic material and quantum dots.

The flexible display apparatus 10 may include a display area DA arranged on a flexible substrate 101 and a non-display area NDA extending around the display area DA. The flexible display apparatus 10 may provide a certain image by using light emitted from a plurality of pixels arranged in the display area DA.

The display area DA may include data lines such as a data line DL extending in a Y direction, scan lines such as a scan line SL extending in an X direction intersecting with the Y direction, and a plurality of pixels P each connected to the data line DL and the scan line SL. Each pixel P may also be connected to a driving voltage line extending in the Y direction.

The plurality of pixels P may each include a display device such as an organic light emitting diode OLED. Each pixel P may emit red, green, blue, or white light. In other embodiments, all of the organic light emitting diodes OLED included in the plurality of pixels P may emit the same color, and the color of each pixel P may be implemented by a color filter, a color conversion layer, or the like arranged over the organic light emitting diode OLED.

Figure 2:
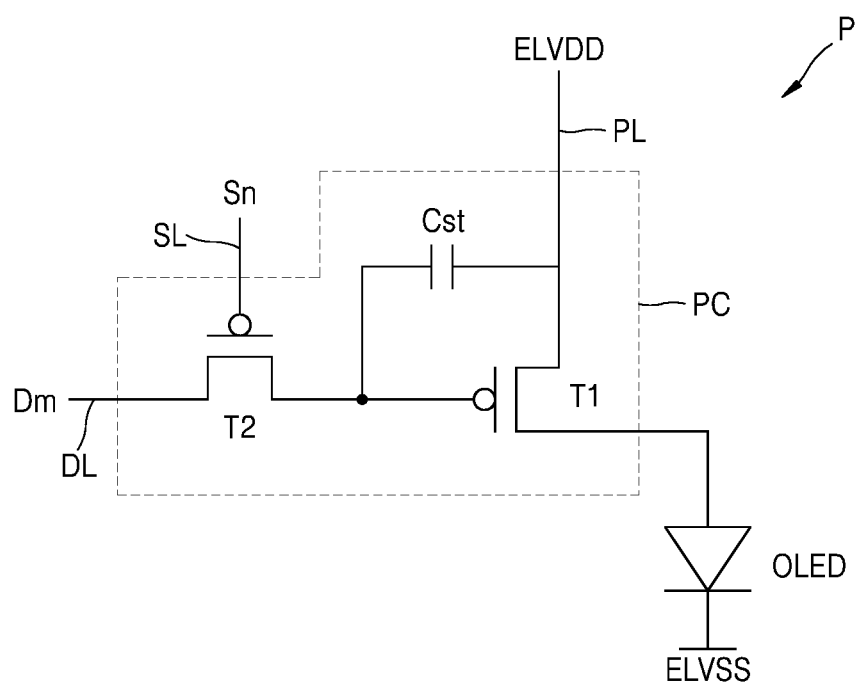
FIG. 2 is an equivalent circuit diagram of an embodiment of a representative one of the pixels of FIG. 1.

FIG. 2 is an equivalent circuit diagram of an embodiment of a representative one of the pixels of FIG. 1.

Referring to FIG. 2, the pixel P may include a pixel circuit PC connected to the scan line SL and the data line DL, and an organic light emitting diode OLED connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL and may be configured to transmit a data signal Dm input through the data line DL to the driving thin film transistor T1 according to a scan signal Sn input through the scan line SL.

The storage capacitor Cst may be connected to the switching thin film transistor T2 and a driving voltage line PL and may store a voltage corresponding to the difference between a voltage received from the switching thin film transistor T2 and a first power voltage ELVDD (or driving voltage) supplied to the driving voltage line PL.

The driving thin film transistor T1 may be connected to the driving voltage line PL and the storage capacitor Cst and may control a driving current flowing from the driving voltage line PL through the organic light emitting diode OLED in response to a voltage value stored in the storage capacitor Cst. The organic light emitting diode OLED may emit light with a certain brightness according to the driving current.

While FIG. 2 illustrates a case where the pixel circuit PC includes two thin film transistors and one storage capacitor, the number and circuit design of the thin film transistors and storage capacitors are not limited thereto and may be variously modified.

Figure 3:
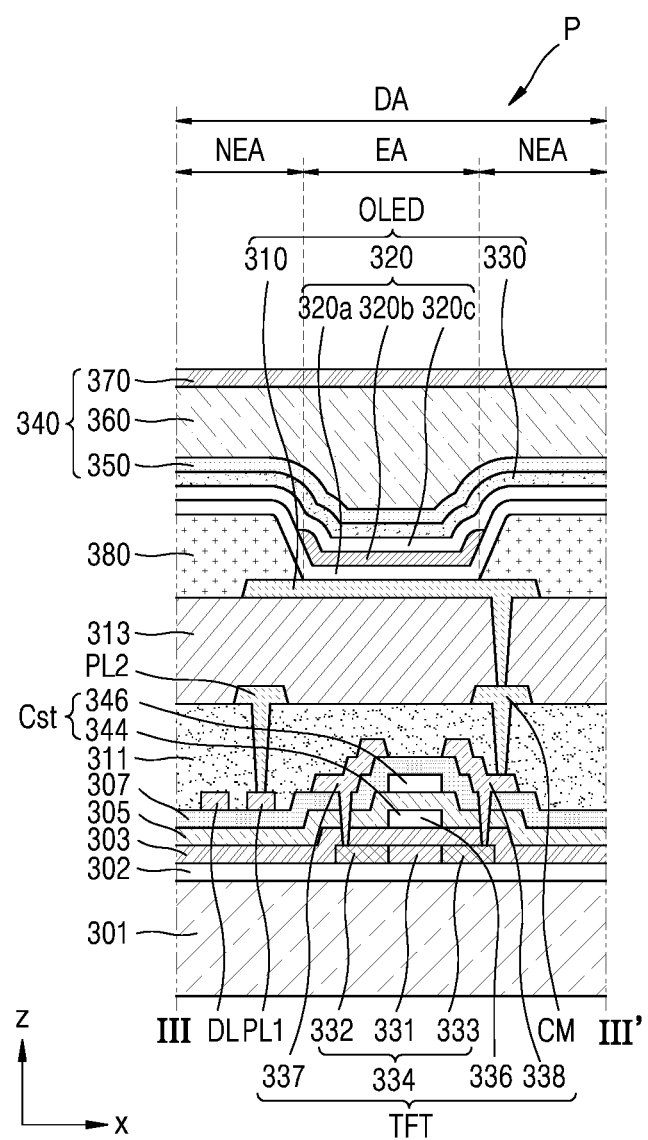
FIG. 3 is a cross-sectional view taken along line of FIG. 1.

FIG. 3 is a cross-sectional view taken along line of FIG. 1.

Referring to FIG. 3, a display device may be arranged on a flexible substrate 301. The display device may include a thin film transistor TFT and an organic light emitting diode OLED. The flexible substrate 301 may include glass or polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, or the like. The flexible substrate 301 may include a single layer or a multiple layer, and in the case of a multilayer structure, the flexible substrate 301 may further include an inorganic layer. The flexible substrate 301 may have a flexible, rollable, or bendable characteristic.

A buffer layer 302 may be disposed on the flexible substrate 301. The buffer layer 302 may be located on the flexible substrate 301 to reduce or block the penetration of foreign materials, moisture, or external air from the bottom of the flexible substrate 301 and may provide a flat surface on the flexible substrate 301. The buffer layer 302 may include an inorganic material such as oxide or nitride, an organic material, or an organic/inorganic composite and may include a single layer or a multiple layer of an inorganic material and an organic material.

A thin film transistor TFT may be disposed on the buffer layer 302. The thin film transistor TFT may include a semiconductor layer 334, a gate electrode 336 overlapping the semiconductor layer 334, and a source electrode 337 and a drain electrode 338 electrically connected to the semiconductor layer 334. The thin film transistor TFT may be connected to the organic light emitting diode OLED to drive the organic light emitting diode OLED.

The semiconductor layer 334 may be disposed on the buffer layer 302, and may include a channel area 331 overlapping the gate electrode 336, and a source area 332 and a drain area 333 which are arranged on both sides of the channel area 331 and include impurities of a higher concentration than the channel area 331. Here, the impurities may include N-type impurities or P-type impurities. The source area 332 and the drain area 333 may be electrically connected to the source electrode 337 or the drain electrode 338.

The semiconductor layer 334 may include an oxide semiconductor and/or a silicon semiconductor. When the semiconductor layer 334 includes an oxide semiconductor, the semiconductor layer 334 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the semiconductor layer 334 may include InSnZnO (ITZO) or InGaZnO (IGZO). When the semiconductor layer 334 includes a silicon semiconductor, the semiconductor layer 334 may include, for example, amorphous silicon (a-Si) or low temperature poly-silicon (LTPS) crystallized from amorphous silicon (a-Si).

A first gate insulating layer 303 may be disposed on the semiconductor layer 334. The first gate insulating layer 303 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 303 may include a single layer or a multiple layer including the above inorganic insulating material.

A gate electrode 336 may be disposed on the first gate insulating layer 303. The gate electrode 336 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may include a single layer or a multiple layer. The gate electrode 336 may be connected to a gate line.

A second gate insulating layer 305 may be disposed on the gate electrode 336. The second gate insulating layer 305 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 305 may include a single layer or a multiple layer including the above inorganic insulating material.

A storage capacitor Cst may be disposed on the second insulating layer 305. The storage capacitor Cst may include a lower electrode 344 and an upper electrode 346 overlapping the lower electrode 344. The lower electrode 344 of the storage capacitor Cst may be connected to the gate electrode 336 of the thin film transistor TFT and may be integrally formed therewith. In other embodiments, the storage capacitor Cst may not overlap the thin film transistor TFT, and a lower electrode of the storage capacitor Cst may be separately formed from the gate electrode 336 of the thin film transistor TFT.

The upper electrode 346 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may include a single layer or a multiple layer.

An interlayer insulating layer 307 may be disposed on the upper electrode 346 of the storage capacitor Cst. The interlayer insulating layer 307 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 307 may include a single layer or a multiple layer including the above inorganic insulating material.

A data line DL, a lower driving voltage line PL1, a source electrode 337, and a drain electrode 338 may be disposed on the interlayer insulating layer 307. The data line DL, the lower driving voltage line PL1, the source electrode 337, and the drain electrode 338 may include a conductive material including molybdenum (Mo), aluminum (Al), copper (Cu), titanium (Ti), or the like and may include a single layer or a multiple layer. The data line DL, the lower driving voltage line PL1, the source electrode 337, and the drain electrode 338 may include a multiple layer of Ti/Al/Ti. In an embodiment, the data line DL, the lower driving voltage line PL1, the source electrode 137, and the drain electrode 338 may include the same material.

The data line DL may be electrically connected to a data driving circuit. A data signal of the data driving circuit may be provided to the pixel P through the data line DL. A scan line electrically connected to a scan driving circuit may be disposed on the first gate insulating layer 303 or the second gate insulating layer 305, and an emission control line electrically connected to an emission driving circuit may be disposed on the first gate insulating layer 303 or the second gate insulating layer 305. A scan signal of the scan driving circuit may be provided to the pixel P through the scan line, and an emission control signal of the emission driving circuit may be provided to the pixel P through the emission control line.

A first planarization layer 311 may be disposed on the data line DL, the lower driving voltage line PL1, the source electrode 337, and the drain electrode 338. The first planarization layer 311 may be formed as a single layer or a multiple layer including an organic material or an inorganic material. In an embodiment, the first planarization layer 311 may include a general-purpose polymer such as benzocyclobutene (BCB), polyimide (PI), hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

The first planarization layer 311 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the forming of the first planarization layer 311, chemical mechanical polishing may be performed to provide a flat upper surface.

An upper driving voltage line PL2 and a contact metal layer CM may be disposed on the first planarization layer 311. The upper driving voltage line PL2 and the contact metal layer CM include aluminum (Al), copper (Cu), titanium (Ti), or the like and may include a multiple layer or a single layer. The upper driving voltage line PL2 and the contact metal layer CM may include a multiple layer of Ti/Al/Ti. In an embodiment, the upper driving voltage line PL2 and the contact metal layer CM may include the same material.

The upper driving voltage line PL2 may be electrically connected to the lower driving voltage line PL1 through a contact hole penetrating the first planarization layer 311 to prevent a voltage drop of the driving voltage provided through the driving voltage line.

The contact metal layer CM may be electrically connected to the thin film transistor TFT through a contact hole penetrating the first planarization layer 311, and a pixel electrode 310 may be electrically connected to the contact metal layer CM through a contact hole penetrating a second planarization layer 313.

The second planarization layer 313 may be disposed on the upper driving voltage line PL2 and the contact metal layer CM. The second planarization layer 313 may be formed as a single layer or a multiple layer including an organic material or an inorganic material. In an embodiment, the second planarization layer 313 may include a general-purpose polymer such as benzocyclobutene (BCB), polyimide (PI), hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or any blend thereof.

The second planarization layer 313 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the forming of the second planarization layer 313, chemical mechanical polishing may be performed to provide a flat upper surface.

An organic light emitting diode OLED including a pixel electrode 310, an intermediate layer 320, and an opposite electrode 330 may be disposed on the second planarization layer 113. The pixel electrode 310 may be electrically connected to the contact metal layer CM through a contact hole penetrating the second planarization layer 313, and the contact metal layer CM may be electrically connected to the drain electrode 338 (or the source electrode 337) of the thin film transistor TFT through a contact hole penetrating the first planarization layer 311, and accordingly the organic light emitting diode OLED may be electrically connected to the thin film transistor TFT.

A pixel electrode 310 may be disposed on the second planarization layer 313. The pixel electrode 310 may include a (semi)translucent electrode or a reflective electrode. The pixel electrode 310 may include a reflective layer formed of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or any compound thereof and a transparent or semi-transparent electrode layer formed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 310 may include ITO/Ag/ITO.

A pixel definition layer 380 may be disposed on the second planarization layer 313, and the pixel definition layer 380 may include an opening exposing at least a portion of the pixel electrode 310. An area exposed by the opening of the pixel definition layer 380 may be defined as an emission area EA. The periphery of the emission area EA may be a non-emission area NEA, and the non-emission area NEA may surround the emission area EA. Particularly, the display area DA may include a plurality of emission areas EA and a non-emission area NEA surrounding the plurality of emission areas EA. The pixel definition layer 380 may increase the distance between the pixel electrode 310 and the opposite electrode 330 over the pixel electrode 310 to prevent an arc or the like from occurring at the edge of the pixel electrode 310. The pixel definition layer 380 may include an organic insulating material such as polyimide, polyamide, acrylic resin, benzocyclobutene, hexamethyldisiloxane (HMDSO), or phenol resin and may be formed by a method such as spin coating.

An intermediate layer 320 may be disposed on the pixel electrode 310 at least partially exposed by the pixel definition layer 380. The intermediate layer 320 may include an emission layer 320b, and a first functional layer 320a and a second functional layer 320c may be selectively disposed under and over the emission layer 320b.

The first functional layer 320a may include a hole injection layer (HIL) and/or a hole transport layer (HTL), and the second functional layer 320c may include an electron transport layer (ETL) and/or an electron injection layer (EIL).

The emission layer 320b may include a low molecular weight organic material or a high molecular weight organic material.

When the emission layer 320b includes a low molecular weight organic material, the intermediate layer 320 may include a hole injection layer, a hole transport layer, a emission layer, an electron transport layer, an electron injection layer, and the like that are stacked in a single or complex structure.

The low molecular weight organic material may include various organic materials such as copper phthalocyanine (CuPc), N,N'-di(napthalene-1-yl)-N,N'-diphenyl-benzidine, and tris-8-hydroxyquinoline aluminum ($Alq_3$). These layers may be formed by vacuum deposition.

When the emission layer 320b includes a high molecular weight organic material, the intermediate layer 320 may have a structure including a hole transport layer and a emission layer. In this case, the hole transport layer may include poly(3,4-ethylenedioxythiophene) (PEDOT) and the emission layer may include a high molecular weight material such as poly-phenylene vinylene (PPV) and polyfluorene. The emission layer may be formed by screen printing, inkjet printing, laser induced thermal imaging (LITI), or the like.

An opposite electrode 330 may be disposed on the intermediate layer 320. The opposite electrode 330 may cover the intermediate layer 320. In an embodiment, the opposite electrode 330 may be disposed over the display area DA and may entirely cover the display area DA. The opposite electrode 330 may be integrally formed over the entire panel to cover a plurality of pixels P arranged in the display area DA, by using an open mask.

The opposite electrode 330 may include a conductive material having a low work function. For example, the opposite electrode 330 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. The opposite electrode 330 may further include a layer such as ITO, IZO, ZnO, or $In_2O_3$ on the (semi)transparent layer including the above material.

The organic light emitting diode OLED may be covered by an encapsulation layer such as a thin film encapsulation layer 340. The thin film encapsulation layer 340 may include at least one inorganic encapsulation layer and at least one organic encapsulation layer. In an embodiment, the thin film encapsulation layer 340 may include a first inorganic encapsulation layer 350 and a second inorganic encapsulation layer 370 and an organic encapsulation layer 360 therebetween.

Each of the first inorganic encapsulation layer 350 and the second inorganic encapsulation layer 370 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The organic encapsulation layer 360 may include a polymer-based material. Examples of the polymer-based material may include an acrylic resin, an epoxy resin, polyimide, and/or polyethylene. For example, the organic encapsulation layer 360 may include acrylic resin, polymethylmethacrylate, polyacrylic acid, or the like.

Figure 4:
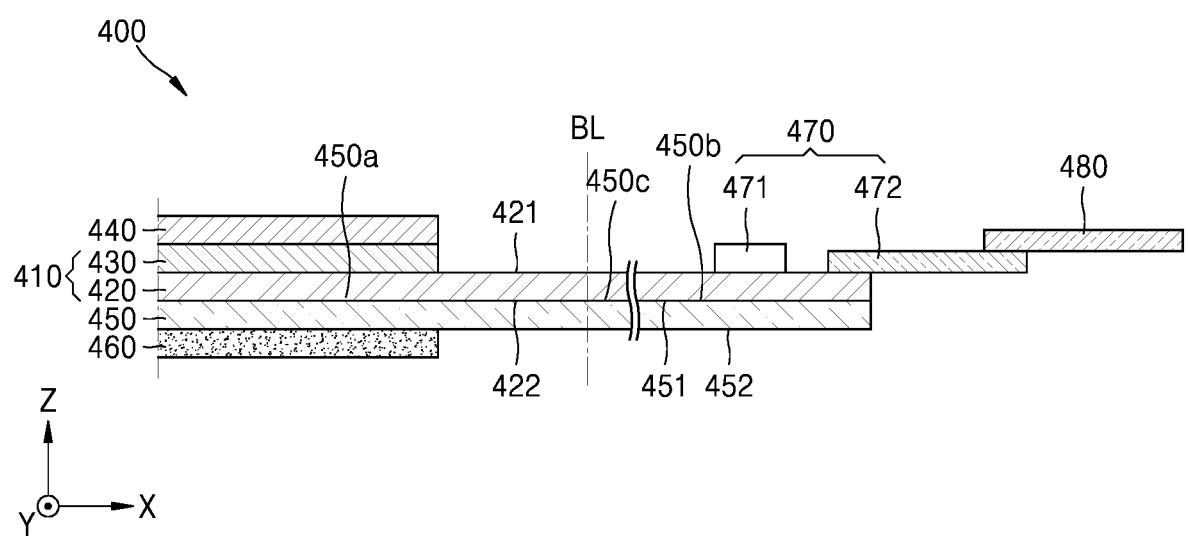
FIG. 4 is a cross-sectional view of an embodiment of the flexible display apparatus of FIG. 1 in an unfolded position.
Figure 5:
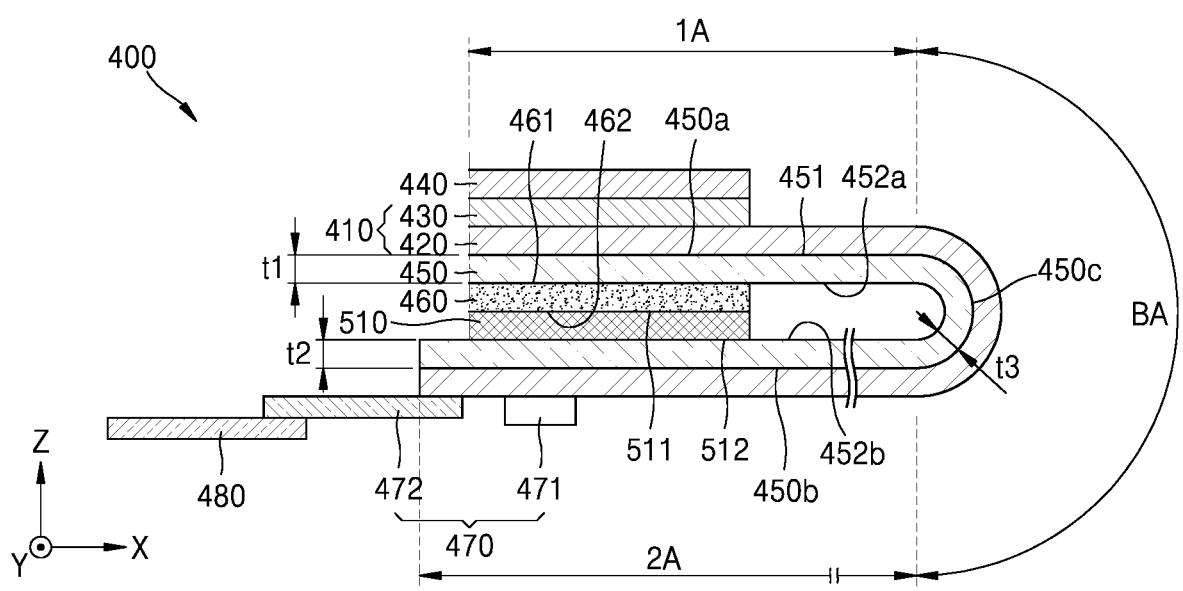
FIG. 5 is a cross-sectional view of the flexible display apparatus of FIG. 4 in a folded position.

FIG. 4 is a cross-sectional view of an embodiment of the flexible display apparatus of FIG. 1 in an unfolded position. FIG. 5 is a cross-sectional view of the flexible display apparatus of FIG. 4 in a folded position.

Referring to FIGS. 4 and 5, a flexible display apparatus 400 may include a flexible display panel 410. The flexible display panel 410 may include a first area 1A, a second area 2A, and a bending area BA between the first area 1A and the second area 2A. The flexible display panel 410 may be bent and/or folded around the bending area BA about a bending axis which is positioned at a point on a bending line BL and extends in the Y direction. The bending axis overlaps the bending area BA. After the bending, the first area 1A and the second area 2A may be vertically arranged and/or overlap in a vertical direction (Z direction). The first area 1A may include the display area DA of FIG. 1. In an embodiment, the first area 1A may include a portion of the non-display area NDA in addition to the display area DA. The second area 2A may also include a display area DA and/or a non-display area NDA. The bending area BA may also include a display area DA and/or a non-display area NDA.

The flexible display panel 410 may include a flexible substrate 420 and a thin film encapsulation layer 430 on the flexible substrate 420. The flexible substrate 420 may extend in the X direction and the Y direction, and the pixels P of FIG. 1 may be arranged on a first surface 421 of the flexible substrate 420. The pixels P may include the pixel circuit PC and the organic light emitting diode OLED connected to the pixel circuit PC as shown in FIG. 2.

In the first area 1A, a thin film encapsulation layer 430 may be disposed on the flexible substrate 420 to cover the organic light emitting diode OLED. A functional layer 440 may be disposed on the thin film encapsulation layer 430. The functional layer 440 may include various layers. For example, the functional layer 440 may include a touch sensing unit, a polarization layer, a window cover, or the like. The touch sensing unit may be integrally formed on the thin film encapsulation layer 430 and may be an electrostatic capacitive type touch sensing unit. The polarizing layer may prevent the external light from being reflected from the display area DA. The polarization layer may be a film type. In other embodiments, the polarization layer may be formed by a deposition process. The window cover may protect the flexible display panel 410.

In the second area 2A, a driving unit 470 electrically connected to the pixels P may be disposed on the flexible substrate 420. The driving unit 470 may include a driving circuit. The driving unit 470 may have a chip-on-plastic (COP) structure. The driving unit 470 may include a driving IC 471 on the flexible substrate 420 and a flexible film 472 electrically connected to the driving IC 471. The driving unit 470 may be disposed on the first surface 421, and may be electrically connected to the pixels P disposed on the first surface 421 of the flexible substrate 420. The driving unit 470 may be disposed on a second surface 422 of the flexible substrate 420 opposing the first surface 421, and may be electrically connected to the pixels P disposed on the first surface 421 of the flexible substrate 420 through a through hole. In other embodiments, the driving unit 470 may have a chip-on-film (COF) structure or a chip-on-glass (COG) structure. The driving unit 470 may be electrically connected to a circuit board 480. The circuit board 480 may include a flexible printed circuit board (FPCB).

The flexible display panel 410 may include an out-foldable flexible display panel. In the out-foldable type flexible display panel 410, a display area DA displaying an image may be located at an outer surface of the flexible display panel 410. The flexible display panel 410 may be configured to view an image in a state of being folded outward. When the flexible display panel 410 is folded outward, the second surface 422 of the flexible substrate 420 in the first area 1A and the second surfaces 422 of the flexible substrate 420 in the second area 2A may face each other.

A first protection layer, which is in the form of a first protection film 450, may be disposed on the flexible substrate 420. The first protection film 450 may be disposed at one surface of the flexible display panel 410 to support the flexible display panel 410. The first protection film 450 may include a first surface 451 facing the flexible display panel 410 and a second surface 452 opposite to the first surface 451. The first surface 451 of the first protection film 450 may be adhered to the second surface 422 of the flexible substrate 420. An adhesive layer may be located between the second surface 422 of the flexible substrate 420 and the first surface 451 of the first protection film 450.

The first protection film 450 may be continuously formed and/or adhered over the first area 1A, the second area 2A, and the bending area BA between the first area 1A and the second area 2A of the flexible display panel 410. Particularly, the first protection film 450 may include a first portion 450a corresponding to the first area 1A, a second portion 450b corresponding to the second area 2A, and a third portion 450c corresponding to the bending area BA. The first portion 450a, the second portion 450b, and the third portion 450c may be continuously adhered to the first area 1A, the second area 2A, and the bending area BA.

In an embodiment, the first portion 450a, the second portion 450b, and the third portion 450c may extend integrally over the first area 1A, the second area 2A, and the bending area BA. More particularly, there may be no gap between the first portion 450a and the third portion 450c adjacent to the first portion 450a, and there may be no gap between the third portion 450c and the second portions 450b adjacent to the third portion 450c. The first protection film 450 may be integrally manufactured because the first protection film 450 has a low modulus.

The first protection film 450 may include a polymer resin having a modulus (Young's modulus) of a range of from about 50 MPa to about 500 MPa in order to prevent a defect such as buckling. For example, the first protection film 450 may be formed of a polymer material having a modulus of about 350 MPa. If the first protection film 450 is formed of a material having a modulus lower than about 50 MPa, a buckling failure may not be prevented. If the first protection film 450 is formed of a material having a modulus higher than about 500 MPa, the bending rigidity of the flexible display panel 410 may increase.

A first thickness t1 of the first portion 450a, a second thickness t2 of the second portion 450b, and a third thickness t3 of the third portion 450c may be equal to each other. For example, the first protection film 450 may have a uniform thickness over the first area 1A, the bending area BA, and the second area 2A of the flexible display panel 410. If the modulus of the first protection film 450 is greater than about 500 MPa, it may be necessary to reduce the third thickness t3 of the third portion 450c in the bending area BA due to a relatively high bending rigidity. However, since the first protection film 450 according to the illustrated embodiment has a modulus in the above range, the first protection film 450 may have a proper bending rigidity in the first and second areas 1A and 2A and the bending area BA, and may prevent the buckling failure from occurring in the first and second areas 1A and 2A and the bending area BA. Accordingly, the first protection film 450 may have the uniform thickness over the entire area of the flexible display panel 410, which may reduce the number of manufacturing processes of the flexible display apparatus 400.

The first protection film 450 may be located inside the flexible display panel 410 that is bent. In FIGS. 4 and 5, the first protection film 450 is shown as being disposed on the second surface 422 of the flexible display panel 410 opposing the first surface 421 on which the pixels P are arranged. When the first protection film 450 is bent due to the bending of the flexible display panel 410, a second surface 452a of the first protection film 450 at the first portion 450a and a second surface 452b of the first protection film 450 at the second portion 450b may face each other. An adhesive member 510 may be located between the first portion 450a and the second portion 450b facing each other to fix the first portion 450a and the second portion 450b to each other. The adhesive member 510 may include a double-sided tape in which a first surface 511 facing the first portion 450a and a second surface 512 opposite to the first surface 511 are all adhesive.

A metal sheet 460 may be further installed under the first portion 450a of the first protection film 450 to reinforce the mechanical strength of the flexible display panel 410. The metal sheet 460 may be selectively adhered to the first area 1A of the flexible display panel 410. In other embodiments, the metal sheet 460 may be additionally adhered to an area where the strength of the flexible display panel 410 needs to be reinforced.

A first surface 461 of the metal sheet 460 may be adhered to the second surface 452a of the first protection film 450 at the first portion 450a. A second surface 462 of the metal sheet 460 may be adhered to the first surface 511 of the adhesive member 510. The second surface 512 of the adhesive member 510 may be adhered to the second surface 452b of the first protection film 450 at the second portion 450b.

In an embodiment, an adhesive layer may be located between the first protection film 450 and the metal sheet 460. For example, the adhesive layer may include a pressure sensitive adhesive (PSA).

In an embodiment, a cushion layer may be further located between the first protection film 450 and the adhesive layer. The cushion layer may have a foam shape or a gel shape. In other embodiments, the cushion layer may include a material having excellent elasticity, for example, rubber.

In an embodiment, a barrier layer may be further located between the first protection film 450 and the adhesive layer.

In an embodiment, at least one slit may be formed in the metal sheet 460.

In an embodiment, a step compensation portion may be disposed under the metal sheet 460.

In an embodiment, a complex functionality may be given to any one of the above functional layers under the first protection film 450.

According to the illustrated embodiment, the first protection film 450 having a uniform thickness and a low modulus is continuously disposed and/or adhered over the first area 1A, the second area 2A, and the bending area BA between the first area 1A and the second area 2A of the flexible display panel 410 in the flexible display apparatus 400. Accordingly, the flexible display apparatus 400 may have the improved bendability and mechanical strength in the bending area BA as well as the first and second areas 1A and 2A even when there is no element such as a bending protection layer at the outer surface of the flexible display panel 410, such as the first surface 421 of the flexible display panel 410.

Figure 6:
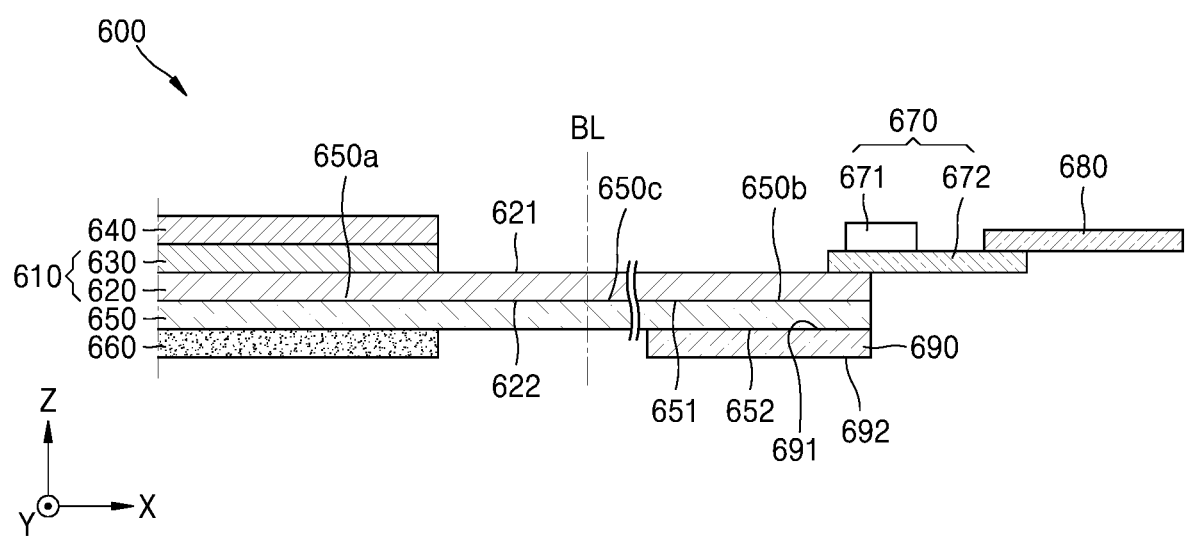
FIG. 6 is a cross-sectional view of an embodiment of the flexible display apparatus of FIG. 1 in an unfolded position.
Figure 7:
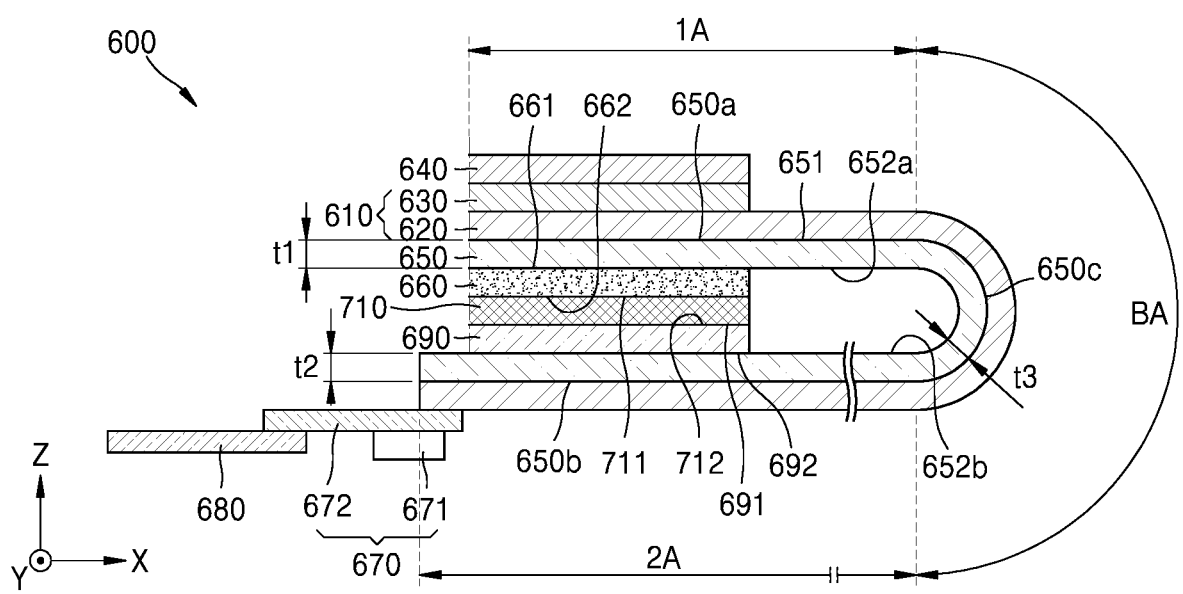
FIG. 7 is a cross-sectional view of the flexible display apparatus of FIG. 6 in a folded position.

FIG. 6 is a cross-sectional view of an embodiment of the flexible display apparatus of FIG. 1 in an unfolded position. FIG. 7 is a cross-sectional view of the flexible display apparatus of FIG. 6 in a folded position.

Because a flexible display apparatus 600 has substantially the same structure as the flexible display apparatus 400 of FIG. 4, the difference therebetween will be mainly described below.

Referring to FIGS. 6 and 7, the flexible display apparatus 600 may include a flexible display panel 610. The flexible display panel 610 may include a first area 1A, a second area 2A, and a bending area BA between the first area 1A and the second area 2A.

The flexible display panel 610 may include a flexible substrate 620 and a thin film encapsulation layer 630 on the flexible substrate 620. The flexible substrate 620 may extend in the X direction and the Y direction, and may be bent and/or folded about a bending axis which is positioned at a bending line BL.

In the first area 1A, a thin film encapsulation layer 630 may be disposed on a first surface 621 of the flexible substrate 620, and a functional layer 640 may be disposed on the thin film encapsulation layer 630. In the second area 2A, a driving unit 670 electrically connected to the pixels P (see FIG. 2) may be disposed on the flexible substrate 620. The driving unit 670 may have a chip-on-film (COF) structure. The driving unit 670 may include a driving IC 671 and a flexible film 672 mounted with the driving IC 671. The driving unit 670 may be disposed on the first surface 621 and/or a second surface 622 of the flexible substrate 620, and may be electrically connected to the pixels P arranged at the first surface 621 of the flexible substrate 620. In other embodiments, the driving unit 670 may have a chip-on-plastic (COP) structure or a chip-on-glass (COG) structure. The driving unit 670 may be electrically connected to a circuit board 680. The circuit board 680 may include a flexible printed circuit board (FPCB). The flexible display panel 610 may include an out-foldable flexible display panel.

A first protection film 650 may be disposed on the flexible substrate 620. The first protection film 650 may include a first surface 651 facing the flexible display panel 610 and a second surface 652 opposite to the first surface 651. The first surface 651 of the first protection film 650 may be adhered to the second surface 622 of the flexible substrate 620.

The first protection film 650 may be continuously formed and/or adhered over the first area 1A, the second area 2A, and the bending area BA between the first area 1A and the second area 2A of the flexible display panel 610. Particularly, the first protection film 650 may include a first portion 650a corresponding to the first area 1A, a second portion 650b corresponding to the second area 2A, and a third portion 650c corresponding to the bending area BA. The first portion 650a, the second portion 650b, and the third portion 650c may be continuously adhered to the first area 1A, the second area 2A, and the bending area BA. In an embodiment, the first portion 650a, the second portion 650b, and the third portion 650c may extend integrally over the first area 1A, the second area 2A, and the bending area BA. A first thickness t1 of the first portion 650a, a second thickness t2 of the second portion 650b, and a third thickness t3 of the third portion 650c may be equal to each other.

A second protection layer, which is in the form of a second protection film 690, may be disposed on the second surface 652 of the first protection film 650 under the second portion 650b of the first protection film 650. The second protection film 690 may have a different modulus than the first protection film 650. The second protection film 690 may include a protection film additionally adhered to reinforce the rigidity of the second portion 650b of the first protection film 650.

The first protection film 650 may be located inside the flexible display panel 610 that is bent. When the first protection film 650 is bent due to the bending of the flexible display panel 610, the first portion 650a and the second portion 650b of the first protection film 650 may face each other. The second protection film 690 may be located between the first portion 650a and the second portion 650b of the first protection film 650 that is bent.

An adhesive member 710 may be located between the first portion 650a and the second portion 650b of the first protection film 650 that face each other. The adhesive member 710 may include a double-sided tape in which a first surface 711 facing the first portion 650a and a second surface 712 opposite to the first surface 711 are all adhesive. The second protection film 690 may be located between the adhesive member 710 and the second portion 650b of the first protection film 650.

A metal sheet 660 may be further installed under the first portion 650a of the first protection film 650 to reinforce the mechanical strength of the flexible display panel 610. The metal sheet 660 may be selectively adhered to the first area 1A of the flexible display panel 610.

A first surface 661 of the metal sheet 660 may be adhered to a second surface 652a of the first protection film 650 at the first portion 650a. A second surface 662 of the metal sheet 660 may be adhered to the first surface 711 of the adhesive member 710. The second surface 712 of the adhesive member 710 may be adhered to a first surface 691 of the second protection film 690. A second surface 692 of the second protection film 690 may be adhered to a second surface 652b of the first protection film 650 at the second portion 650b.

The modulus of the second protection film 690 may be higher than the modulus of the first protection film 650. The first protection film 650 may include a polymer resin having a modulus (Young's modulus) of a range from about 50 MPa to about 500 MPa. For example, the first protection film 650 may be formed of a polymer material having a modulus of about 350 MPa. The second protection film 690 may include a polymer resin having a modulus of about 1000 MPa or more. For example, the second protection film 690 may be formed of a polymer material having a modulus of about 4000 MPa. The second protection film 690 may reinforce the rigidity and/or strength of a portion of the first protection film 650 overlapping the second protection film 690, such as the second portion 650b. If the second protection film 690 includes a material having a modulus lower than about 1000 MPa, the strength of the first protection film 650 may not be reinforced. Materials of the second protection film 690 are not limited thereto as long as the second protection film 690 includes a material having a modulus higher than about 1000 MPa.

The metal sheet 660 may be disposed under the first portion 650a of the first protection film 650. Accordingly, the rigidity of the first protection film 650 may be reinforced. On the other hand, the metal sheet 660 may not be disposed under the second portion 650b of the first protection film 650. In some cases, it may be necessary to reinforce the rigidity of the second portion 650b of the first protection film 650. For this purpose, a second protection film 690 having a higher modulus than the first protection film 650 may be provided under the second portion 650b of the first protection film 650.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A flexible display apparatus comprising:
   a flexible display panel including a first area, a second area, and a bending area between the first area and the second area;
   a first protection layer including a first surface facing the flexible display panel and a second surface opposite to the first surface; and
   a driving unit electrically connected to the flexible display panel,
   wherein:
   the first protection layer is disposed continuously over the first area, the second area, and the bending area to be adhered to the flexible display panel;
   the first protection layer comprises a first protection film including a first portion corresponding to the first area, a second portion corresponding to the second area, and
a third portion corresponding to the bending area;
the first portion, the second portion, and the third portion extend integrally over the first area, the second area, and the bending area; and
the flexible display apparatus further comprises a second protection film disposed on the second surface under the second portion of the first protection film.

2. The flexible display apparatus of claim 1, wherein the first portion, the second portion, and the third portion have a thickness substantially the same as each other.

3. The flexible display apparatus of claim 1, wherein the first protection film is disposed inside the flexible display panel that is bent.

4. The flexible display apparatus of claim 3, further comprising an adhesive member,
wherein the first portion and the second portion of the first protection film face each other inside the flexible display panel that is bent, and
wherein the adhesive member is disposed between the first portion and the second portion.

5. The flexible display apparatus of claim 4, further comprising a metal sheet disposed on the second surface under the first portion of the first protection film,
wherein a first surface of the metal sheet contacts the second surface of the first protection film, and
wherein a second surface of the metal sheet is adhered to the adhesive member.

6. The flexible display apparatus of claim 1, wherein the first protection film is located inside the flexible display panel that is bent, and
the second protection film is disposed between the first portion and the second portion of the first protection film that is bent.

7. The flexible display apparatus of claim 6, further comprising an adhesive member,
wherein the first portion and the second portion of the first protection film face each other inside the flexible display panel that is bent,
wherein the adhesive member is disposed between the first portion and the second portion, and
wherein the second protection film is disposed between the second portion and the adhesive member.

8. The flexible display apparatus of claim 6, further comprising a metal sheet disposed on the second surface under the first portion,
wherein a first surface of the metal sheet contacts the second surface of the first protection film, and
wherein a second surface of the metal sheet is adhered to the adhesive member.

9. The flexible display apparatus of claim 1, wherein the second protection film has a modulus higher than a modulus of the first protection film.

10. The flexible display apparatus of claim 9, wherein the modulus of the first protection film is in a range from about 50 MPa to about 500 MPa.

11. The flexible display apparatus of claim 1, wherein the first protection film includes a polymer resin having a modulus in a range from about 50 MPa to about 500 MPa.

12. The flexible display apparatus of claim 1, wherein the flexible display panel includes an out-foldable flexible display panel.

13. A flexible display apparatus comprising:
a flexible substrate bent around a bending axis and including a display area to display an image and a non-display area extending outside the display area;
an encapsulation layer covering the display area;
at least one functional layer disposed on the thin film encapsulation layer;
a first protection layer including a first surface facing the flexible substrate and a second surface opposite to the first surface; and
a driving unit electrically connected to the display area,
wherein:
the first protection layer is disposed continuously on a surface of the flexible substrate opposite to the encapsulation layer;
the first protection layer comprises a first protection film extending integrally over the entire area of a surface of the flexible substrate that is bent; and
the flexible display apparatus further comprises a second protection film having a higher modulus than the first protection film and disposed under the first protection film.

14. The flexible display apparatus of claim 13, further comprising an adhesive member,
wherein the first protection film is disposed inside the flexible substrate that is bent,
wherein portions of the first protection film face each other inside the flexible substrate, and
wherein the adhesive member is disposed between the portions of the first protection film.

15. The flexible display apparatus of claim 13, wherein the first protection film is disposed inside the flexible substrate that is bent, and the second protection film is disposed between portions of the first protection film facing each other.

16. The flexible display apparatus of claim 15, wherein the first protection film has a modulus in a range from about 50 MPa to about 500 MPa.

* * * * *